United States Patent [19]

Cheung

[11] Patent Number: 4,701,592
[45] Date of Patent: Oct. 20, 1987

[54] LASER ASSISTED DEPOSITION AND ANNEALING

[75] Inventor: Jeffrey T. Cheung, Thousand Oaks, Calif.

[73] Assignee: Rockwell International Corporation, El Segundo, Calif.

[21] Appl. No.: 207,315

[22] Filed: Nov. 17, 1980

[51] Int. Cl.[4] .............................................. B23K 26/00
[52] U.S. Cl. ..................... 219/121 LT; 219/121 LS; 219/121 LE; 219/121 LF; 427/53.1
[58] Field of Search ...... 219/121 L, 121 LE, 121 LF, 219/121 LS, 121 LT, 121 LP, 121 LW; 427/53.1, 42; 148/1.5, 187; 357/91

[56] References Cited

U.S. PATENT DOCUMENTS

| | | | |
|---|---|---|---|
| 4,128,752 | 12/1978 | Gravel | 219/121 LP |
| 4,135,077 | 1/1979 | Wills | 219/121 LS |
| 4,146,380 | 3/1979 | Caffarella et al. | 219/121 LT |
| 4,151,008 | 4/1979 | Kirkpatrick | 219/121 L |
| 4,214,015 | 7/1980 | Stephan | 427/42 |
| 4,217,374 | 8/1980 | Ovshinsky et al. | 427/53.1 |
| 4,230,515 | 10/1980 | Zajac | 219/121 PG |
| 4,250,009 | 2/1981 | Cuomo et al. | 204/192 EC |
| 4,281,030 | 7/1981 | Silfuast | 219/121 LE |

Primary Examiner—M. H. Paschall
Attorney, Agent, or Firm—H. Fredrick Hamann; Craig O. Malin; John J. Deinken

[57] ABSTRACT

Disclosed is an apparatus for depositing a layer of a material on a substrate and annealing the deposited layer, including a Q-switched Nd: YAG laser for providing a coherent light output. An up collimator is situated in the path of the coherent light output to increase the cross sectional area of the output, while a beam divider separates the output into first and second coherent beams. First and second lenses are adjustably positioned in the paths of the beams to focus the first beam on a source of the material and the second beam on the substrate. First and second x-y scanners are provided for scanning the first and second beams. A vacuum chamber includes a connection for a vacuum source and windows to admit the first and second beams into the chamber. A source support positions a source of the material within the chamber in the path of the first beam and a substrate support positions the substrate in the path of the second beam and at least 45° away from the normal to the surface of the source.

13 Claims, 2 Drawing Figures

LASER ASSISTED DEPOSITION AND ANNEALING

GOVERNMENT RIGHTS

The Government has rights in this invention pursuant to Contract No. MDA903-79-C-0188, awarded by the Defense Supply Service, and Contract No. F04701-17-C-0107, awarded by the Air Force.

BACKGROUND OF THE INVENTION

This invention relates to the forming of thin films and, more particularly, to forming thin films by vapor deposition.

The technique of thin film deposition is one of the most important processes in the manufacture of solid state electronic devices. In terms of its essential components, this deposition process involves three basic steps: producing a vapor from a source material, transporting the vapor to a substrate, and condensing the vapor on the substrate to form a thin film layer.

In some of the early evaporation techniques, a resistance heated wire, strip, or boat of W, Ta, or Mo was placed in a vacuum chamber to contain or support the material to be evaporated. After sufficient heating, the evaporant condensed and formed a film on a substrate which was positioned in the vacuum chamber near the heated element. This technique, however, exhibited some significant disadvantages. Any heated component, for example, will react with many types of evaporants, particularly oxides, causing decomposition or contamination of the deposited film. Another problem arises when the evaporant is produced from an incongruent material, i.e., one with constituents which exhibit considerably different volatilities. The vapor from such materials will deposit in a film which is not stoichiometric with the evaporant, because the film will include an excessive concentration of the component having a higher volatility.

Flash evaporation was developed to overcome this problem with incongruent materials. In the flash technique, a small quantity of material is rapidly and completely evaporated to produce a film of the same composition as the evaporant. Co-evaporation, where different substances are evaporated at different rates and brought into contact to react at the substrate, has also been used to alleviate the problem of incongruent evaporation. The latter two methods, however, do not provide a solution to the problem of impurities which are introduced by the presence of a heated element in the vacuum chamber.

Further improvements in the film deposition art have been realized by heating only a selected portion of the evaporant material with an electron beam or by ion bombardment (sputtering). These methods have been found to be preferable for the deposition of undecomposed oxides, such as $SiO_2$, $Al_2O_3$, and $ThO_2$, and for the evaporation of high melting point metals, such as Pt and Ir.

More recently, thin films have been formed by vacuum deposition through the use of a laser located outside the vacuum chamber. This technique is particularly suitable for producing exceptionally pure coatings, since ultrahigh vacuum conditions can be maintained with a thoroughly baked out vacuum system. High purity levels are possible with this approach because the laser heats only a small volume of material located at the focal point of the coherent light beam and thus does not extensively heat the container for the source material. Since the remainder of the vacuum system is not heated, it is possible with a laser deposition process to introduce a variety of gases into the evaporation chamber and thus achieve effects similar to "reaction sputtering", so that this technique may also be utilized to provide doping for the film which is formed. Furthermore, the rate of film formation is not problematic with laser deposition, since deposition rates exceeding 1000 Å/min are readily achievable. A particularly attractive feature of the laser technique is that it allows congruent evaporation of some materials which normally evaporate incongruently. This is accomplished because only a small volume of material located at the laser focal point is elevated to a temperature sufficient to produce a vapor stoichiometric with the evaporant, while the conduction of heat away from the focal point is slow relative to this localized heating and evaporation.

Those laser evaporation techniques which are known in the art, however, have exhibited some limitations. One disadvantage of the laser technique, for example, which has been observed in previous laser evaporation work is that the laser tends to cause "splashing" of the source material. This splashing occurs because the high power level of the laser causes the eruption of the source surface with hot solid particles and liquid droplets. This effect results in a deposited film with poor morphology and low crystalline quality. Consequently, a need has developed in the art for an improved laser deposition technique.

SUMMARY OF THE INVENTION

It is a general objective of this invention to provide a new and improved Laser Assisted Deposition and Annealing (LADA) technique for depositing a layer of a material on a substrate and annealing the deposited layer. In one embodiment the apparatus of this invention includes a vacuum chamber for connection to a vacuum source, with a source support and a substrate support contained within the vacuum chamber. The source support is provided for positioning a source of the material within the chamber in the path of a first coherent beam of light, while the substrate support is provided for positioning the substrate within the chamber in the path of a second coherent beam of light.

In a more particular embodiment, the substrate support is positioned at least approximately 45° away from a direction normal to the source support. In addition, the source and substrate supports may be rotating supports, while shources of heat may be provided on the substrate and source supports for heating the substrate and source, respectively. A cooled panel may be positioned behind the substrate support with respect to the source support to prevent multiple collisions of the evaporated material with the substrate.

The apparatus may further include a laser for providing a coherent light output, with a beam divider for separating the coherent light output into the first and second coherent beams of light. A first window is provided in the vacuum chamber for admitting the first coherent beam into the chamber, while a second window in the chamber similarly admits the second coherent beam.

This embodiment may also include an up collimator situated in the path of the coherent light output for increasing the cross-sectional area of the coherent light output. A mirror may be positioned within the vacuum chamber to intercept the first coherent beam and reflect the first coherent beam in the direction of the source support, while a baffle is positioned in the vacuum chamber to isolate the second window from the evaporated material. The aforesaid mirror may be equipped with a revolving mount for rotating the mirror and a shield for covering a major portion of the mirror, the mount and shield being adapted to minimize contact between the evaporative material and the surface of the mirror.

In a further detailed embodiment a first x-y scanner may be situated in the path of the first coherent beam of light for scanning the first beam over the source of material, while a second x-y scanner may similarly be situated in the path of the second coherent beam of light for scanning the second beam over the substrate.

This apparatus may be equipped for multiple source evaporation by including a second beam divider for separating the first coherent beam of light into a third coherent beam and a fourth coherent beam, the third coherent beam passing through the first window into the vacuum chamber and impinging on the source of the material, while a third window is provided in the vacuum chamber for admitting the fourth beam, and a second source support is provided for positioning a second source of a second material within the chamber in the path of the fourth coherent beam of light.

The invention also encompasses a method for depositing and annealing a layer of a material on a substrate, the method including the steps of:

(a) placing the substrate in an evacuated chamber,
(b) placing a source of the material in the evacuated chamber,
(c) applying a first coherent beam of light to the source to evaporate the material and deposit the evaporated material in a layer on the substrate, and
(d) applying a second coherent beam of light to the substrate to anneal the layer.

In a more particular embodiment, the method includes the steps of:

(a) placing the substrate in an evacuated chamber,
(b) placing a source of the material in the evacuated chamber,
(c) providing a laser with a coherent light output,
(d) dividing the laser output into a first coherent beam of light and a second coherent beam of light,
(e) applying the first coherent beam of light to the source to evaporate the material and deposit the evaporated material in a layer on the substrate, and
(f) applying the second coherent beam of light to the substrate to anneal the layer.

These examples summarize some of the more important features of this invention, in order to facilitate an understanding of the detailed description which follows and so that the contributions which the invention provides to the art may be better appreciated. There are, of course, additional features of the invention, which will be further described below and which are included within the subject matter of the appended claims.

BRIEF DESCRIPTION OF THE DRAWINGS

Additional objectives, features, and advantages of the present invention will be evident from the description below of the preferred embodiments and the accompanying drawings, wherein the same numerals are used to refer to like elements throughout all the figures. In the drawings.

DESCRIPTION OF THE PREFERRED EMBODIMENTS

Figure 1:
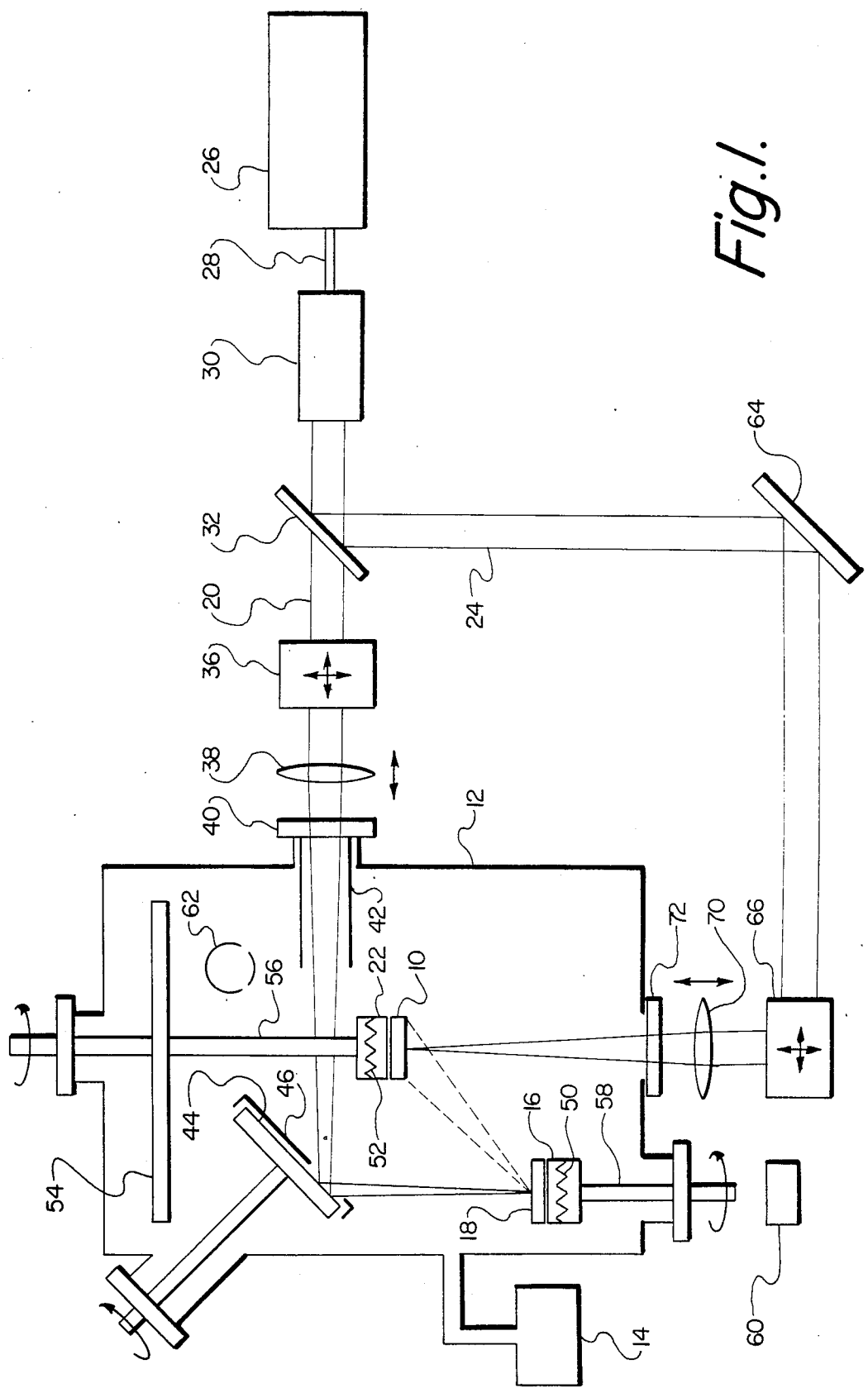
FIG. 1 is a schematic drawing illustrating a first embodiment of the invention.

Illustrated in schematic form in FIG. 1 is an embodiment of the present invention for depositing a layer of material on a substrate 10 and annealing the deposited layer. The essential components of the apparatus are a vacuum chamber 12 for connection to a vacuum source 14, a source support 16 for positioning a source 18 of the material within the chamber 12 in the path of a first coherent beam of light 20, and a substrate support 22 for positioning the substrate 10 within the chamber in the path of a second coherent beam of light 24.

In the apparatus of FIG. 1, a Q-switched Nd:YAG laser 26 is utilized to supply a coherent light output 28. There are many commercial laser units available with different wavelengths, power levels, and modes of operation. A careful selection from these, however, is important to the success of the Laser Assisted Deposition and Annealing (LADA) operation of the present invention. Initially, a decision must be made whether to use a continuous wave or pulsed laser. For the same amount of absorbed energy, a surface irradiated by a continuous wave laser will achieve a much lower temperature than a surface irradiated by a pulsed laser. In addition, the surface temperature will rise slowly in the continuous wave case and can reach a constant steady-state level. Pulsed laser operation, by contrast, can induce a very high surface temperature in approximately $10^{-7}$ seconds, enabling a more efficient utilization of energy. Previous laser evaporation studies have concluded that pulsed laser irradiation produces a faster evaporation rate, especially for refractory materials. This fast heating and cooling action in turn can facilitate the congruent evaporation of compound materials. Furthermore, a pulsed laser deposited film will be polycrystalline in structure, as compared to the amorphous film which is obtained with evaporation by a continuous wave laser.

The three types of lasers which are commercially available and exhibit an adequate energy output for LADA applications are $CO_2$ lasers, solid state lasers, such as $Nd^{+2}$: Glass, Ruby, and $Nd^{+2}$: YAG, and gas ion $(Ar^+)$ lasers. Of these, the solid state lasers have been found to be best suited for use in the present invention. They are made for pulsed operation, exhibit high efficiency, and can be Q-switched to produce pulses containing as much as a few joules of energy in a duration of tens of nanoseconds. An ideal choice has been found to be a $Nd^{+2}$: YAG laser equipped with an acousto-optic Q-switch. The output of such a laser can be focused to achieve a peak power density on the order of $10^8$ w/cm for a 100 ns duration pulse.

In FIG. 1, the coherent light output 28 is applied to an up collimator 30, which increases the cross-sectional area of the output. The enlarged output is then applied to a beam divider 32 to separate the output into the first coherent beam of light 20 for evaporating and the second coherent beam of light 24 for annealing.

After passing through the beam divider, the first beam 20 enters a first x-y scanner 36, which is the preferred embodiment is a galvanometric scanner. The first beam then is focused on the surface of the source by a first lens 38. The lens 38 may be moved in the direction of the beam 20 in order to focus or defocus the beam on the source and thereby control the power density which is applied to the source.

The evaporating beam enters the vacuum chamber through a first window 40. It has been found that where there is an unobstructed path between the source 18 and the window 40, the evaporants from the source can condense on the window, increasing the opaqueness of the window and thereby reducing the effective laser power and the deposition rate. Consequently, a baffle tube 42 is provided to isolate the window from the evaporants.

After entering the vacuum chamber the first beam 20 is reflected by a shielded rotating mirror 44 onto the source 18. A slotted shield 46 permits only a small portion of the mirror 44 to be exposed to the evaporant in the vacuum chamber at any given time. Because the mirror is rotated, the small amount of evaporant which reaches the mirror is distributed over the mirror surface, thereby reducing clouding of the mirror and permitting a constant, high deposition rate over a long period of time.

When the first coherent beam is focused onto the source 18 and scanned over the surface by the x-y scanner 36, the material of the source is evaporated, with some of the evaporated material propagating through the chamber 12 to the substrate 10, as indicated by the dotted lines 48, to form a film on the substrate. The evaporant consists of atoms, molecules, and molecular clusters. In addition, if the power level of the beam 20 is sufficiently high, the surface of the source can also erupt with hot solid particles or liquid droplets. High speed photographic studies of this phenomenon, which is known as the splashing effect, have shown that such microparticles can be ejected from the source with velocities of approximately $10^6$ cm/sec. The impact of particles with this amount of kinetic energy can induce damage in the deposited film. Where the splashing effect is sufficiently pronounced to affect the deposition process, the resultant film will exhibit poor morphology and a low crystalline quality, making it necessary to avoid the effect.

Splashing is caused by the subsurface material heating above its boiling point before the material on the surface of the source is completely vaporized. The common solution for avoiding this problem is to lower the laser power enough that the subsurface temperature does not reach the boiling point. This solution is undersirable, however, since the evaporation rate would be drastically reduced as a consequence. The present invention provides a more useful solution to the splashing problem by recognizing that these microparticles leave the surface of the source with a very large velocity component in a direction normal to the surface and with a much smaller velocity component parallel to the surface. As a result, the microparticles tend to predominate within a small conical volume centered about the normal to the source but the evaporated species, such as atoms, molecules, and molecular clusters, have higher lateral velocity components, resulting in a wider angular distribution. Thus, if the substrate is positioned with respect to the source sufficiently away from the conical volume in which the microparticles predominate, the splashing effect can be avoided with the substrate nevertheless remaining in the path of a sufficient quantity of the evaporated species to achieve the desired deposition rate. Therefore, as shown in the apparatus of FIG. 1, the substrate 10 is placed at approximately 45° away from the normal to the source 18. The splashing effect has been found to be nearly eliminated by this arrangement, with the tradeoff being some decrease in the deposition rate.

Another important consideration in achieving a satisfactory LADA deposition is the scan rate of the first beam 20 over the source 18, which is controlled by the first x-y scanner 36. Previous studies have shown laser evaporated species to have very high kinetic energies, on the order of a few electron volts. If evaporants are to condense on a substrate, it is necessary to transfer all of this kinetic energy to the substrate in a single collision. This single collision transfer is required because when a cluster of N atoms impinges on a surface, the impact energy can be quickly redistributed into its 3N-6 vibration modes to promote adhesion. Single atom projectiles, however, will most likely be scattered back. The efficiency of such a transfer will thus be low for free atoms, but high for clusters. Therefore, the resulting film will primarily accure from the deposition of clusters. It is thus important to ensure that the evaporant does not contain high concentrations of any atomic components where congruent evaporation and stoichiometric deposition are necessary.

In order to control the evaporant composition, the scanning rate must also be carefully selected. Where the scan rate is too slow, for example, the surface of the source may experience a much longer heating time than desired. Where the scan rate, for example, is 0.2 cm/sec, the focal point is approximately 0.02 cm in diameter, and the pulse frequency is 5000 Hz, as many as 500 pulses can overlap with a pulse width of $10^{-1}$ sec. With such a slow scan, the surface will effectively be heated by long 100 ms pulses. Such a slow heating and cooling rate can cause an excessive loss of high volatility components. The solution to this problem is to select a scan rate for the x-y scanner 36 which is sufficiently high that the individual pulses from the laser do not overlap.

In order to further control the conditions of deposition, a source heater 50 and a substrate heater 52 are provided to adjust the temperatures of the source 18 and the substrate 10, respectively. A cooled panel 54 is placed behind the substrate in order to prevent multiple collisions of the evaporant. The substrate support 22 is mounted on a rotatable shaft 56 so that the substrate can be rotated to ensure the deposition of a film of uniform thickness. The source support is also rotatably mounted, on a shaft 58. With this arrangement, several different sources can be placed on the support 16 and individually rotated into the path of the beam 20 as desired. Further, an open portion of the support may be provided so that the first beam 20 can pass through the support and be measured by a detector 60. Instrumentation for measuring the composition of the evaporant, such as a mass spectrometer 62, may also be provided. Other monitoring equipment may be used, as will be appreciated by those skilled in the art, such as, for example, an Auger electron spectrometer for determining chemical information about the substrate surface, high energy electron diffraction devices for establishing the surface orientation of the deposited film, and optical devices for monitoring the thickness of the deposited film.

The annealing function of the apparatus shown in FIG. 1 is accomplished with the second coherent beam 24, which is reflected from the beam divider 32. The annealing beam is then directed by a mirror 64 toward a second x-y scanner 66. The second scanner 66 is used to sweep the second beam over the entire surface of the deposited film to anneal the film in situ. A second lens 70 focuses the second beam on the film, while a second window 72 admits the beam into the vacuum chamber. The lens 70 can be translated in the direction of the beam, as with the first lens 38, in order to control the intensity of the annealing beam.

The technique of this invention can be used for the growth of many useful films. Of particular interest are single crystal films of HgCdTe, ZnO, titanates, and refractory metals or metal silicides. All of these films are potentially of high value for advanced electronic device applications, especially if such films can be incorporated into silicon integrated circuit structures.

$Hg_{1-x}Cd_x Te$ is a variable energy bandgap alloy semiconductor system, with its bandgap varying from 0 eV ($x \sim 0.17$) to 1.5 eV ($x = 1$), and is possibly the single most important material available for infrared detector applications. The LADA technique is potentially superior to liquid phase epitaxial methods in terms of the ability to control physical parameters of deposited HgCdTe layers. Furthermore, while CdTe is an ideal substrate material for HgCdTe, the size of a single crystal CdTe substrate is very limited and no technique has previously been available to grow large diameter single crystal CdTe boules. The LADA technique may be used to grow single crystal HgCdTe thin films on more commonly available substrates, such as silicon, sapphire, and thermally grown $SiO_2/Si$ structures, thereby avoiding the need for large size CdTe substrate technology.

Among all the II-VI compounds, ZnO exhibits the largest piezoelectric coupling constant, making it a very suitable material for high efficiency thin film ultrasonic transducers. Other outstanding properties, such as a large optical refractive index and considerable acousto-optic and electro-optic coefficients, suggest other useful applications. ZnO thin films, however, are difficult to prepare because of a high boiling point accompanied by dissociation. With laser assisted deposition and annealing, laser pulses can be utilized to evaporate Zn in an oxidizing atmosphere and depost ZnO reactively, with in situ annealing improving the crystalline quality of the deposited layer.

The titanates, such as $SrTiO_3$, $PbTiO_3$, and $BaTiO_3$, are ferroelectric when in a Perovskite structure. Single crystal thin titanate films are thus useful in a wide variety of device applications such as, for example, high value, thin film capacitors, non-volatile memories, electro-optic switches, pyroelectric detectors, and acoustic transducers. As a particular example, the major criteria for thin film capacitor materials are a high dielectric constant and low loss. The lossiness of titanate films is frequently associated with excess conductivity due to non-stoichometry and contamination in the deposition process. In conventional evaporation procedures, titanate films are decomposed in the vapor phase to oxides such as $TiO_2$, which can be further reduced to conductive titanate oxides. With the LADA technique, however, rapid and spatially focused heating of the source material by laser pulses prevents source thermal decomposition and preserves the stochiometry of the deposited film. Furthermore, the dielectric properties of the titanate films are very sensitive to structural changes. For amorphous $BaTiO_3$, for example, the measured dielectric constant is only approximately 25. With a postdeposition anneal (at 1200° C.), however, the film would be crystallized into a perovskite structure with the dielectric constant increased to 1,200. Such high annealing temperatures, which are not compatible with silicon device processes, may be readily provided by the in situ laser annealing of LADA.

Refractory metals and metal silicides have found increasing applications in microelectronics for forming electrical interconnects, ohmic contacts, and Schottky barriers. Silicides are also potentially useful as superconductors, ferroelelectric materials, and transducers. Since silicide formation is compatible with a silicon substrate, it may find a wide variety of future applications when coupled to siliconon-chip signal processing electronics. The LADA technique can be used to deposit refractory metals and transition metal silicides into silicon and $SiO_2/Si$ substrates. It is also possible to adjust the laser power to induce in situ alloying for the formation of silicides.

Figure 2:
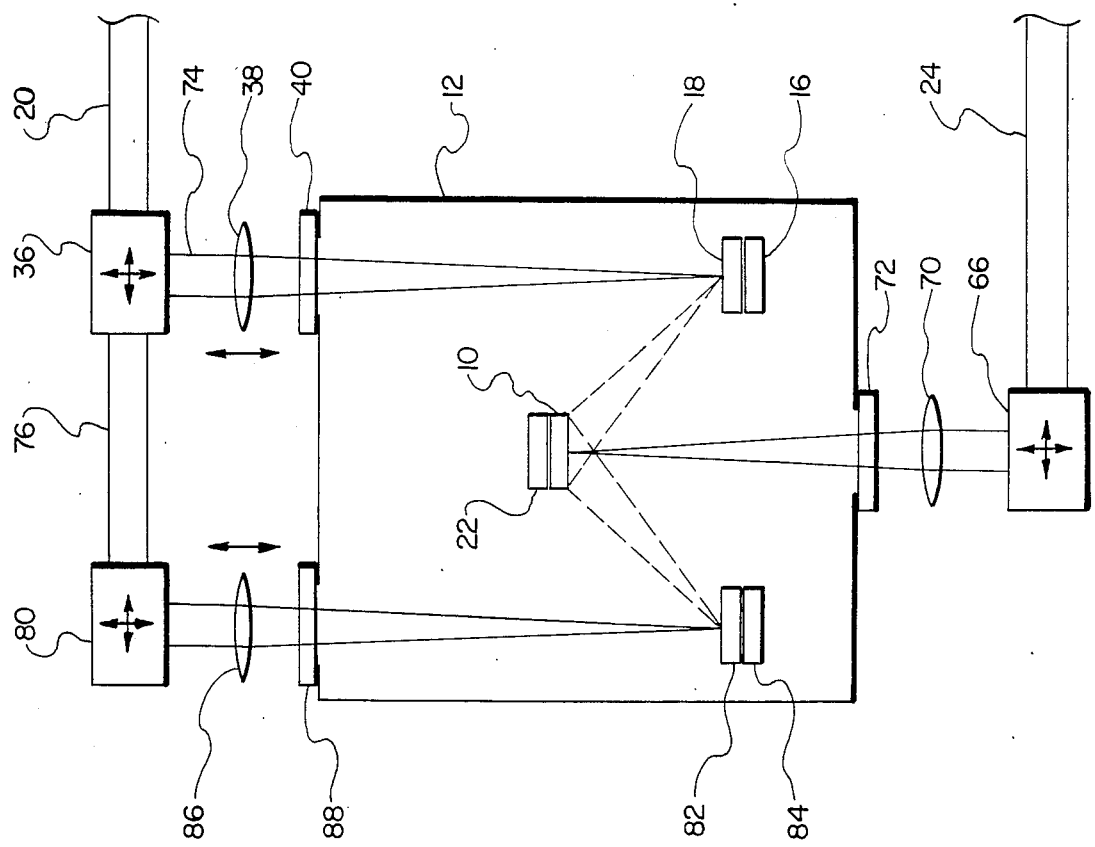
FIG. 2 is a schematic drawing illustrating a second embodiment of the invention.

The LADA technique of this invention may also be employed for the deposition of films of several layers. Shown in FIG. 2 is a schematic diagram illustrating an alternative embodiment of the present invention which is specifically designed to form multiple layer films of different compositions. In this arrangement, a vacuum chamber 12, a source support 16, and a substrate support 22 are provided and are analogous to the same components as they are described for FIG. 1. A similar laser and beam divider system can be utilized to provide a first coherent beam of light 20 and a second coherent beam of light 24. The second beam 24 operates in a similar fashion, by means of a second x-y scanner 66, lens 70, and window 72, to anneal the layer formed on a substrate 10. In the embodiment in FIG. 2, however, additional means are provided to enable the deposition of alternating layers of different compositions or to permit the separate but simultaneous evaporation of different materials at different rates, so that the different evaporants may then combine, react, and condense on the substrate in a film of the desired stoichometry.

In the embodiment of FIG. 2, the first scanner 36 also accomplishes a beam splitting function, by dividing the first beam into a third coherent beam 14 and a fourth coherent beam 76. The third coherent beam is focused on the source 18 by the first lens 38 and through the first window 40. The fourth beam 76 proceeds to a third x-y scanner 80, which sweeps the fourth beam over a second source 82, which is positioned on a second source support 84, by means of a third lens 86 and a third window 88. The lenses 38, 70, and 86 can be adjusted, as in the embodiment of FIG. 1, to control the intensities of the annealing and evaporating beams.

Although additional details are not illustrated in the schematic of FIG. 2, those skilled in the art will appreciate that other features, such as, for example, the baffle tube 42, the rotating mirror 44 and the heaters 50 and 52 of FIG. 1, could readily be adapted to the embodiment shown in FIG. 2.

Although some typical embodiments of the present invention have been illustrated and discussed above, modifications and additional embodiments of the invention will undoubtedly be apparent to those skilled in the art. Various changes, for example, may be made in the configurations, sizes, and arrangement of the components of the invention without departing from the scope of the invention. Furthermore, equivalent elements may be substituted for those illustrated and described herein, parts or connections might be reversed or otherwise interchanged, and certain features of the invention might be utilized independently of the use of other features. Consequently, the examples presented herein, which are provided to teach those skilled in the art how to construct the apparatus and perform the method of this invention, should be considered as illustrative only and not inclusive, the appended claims being indicative of the full scope of the invention.

Which is claimed is:

1. An apparatus for depositing a layer of a material on a substrate and annealing the deposited layer, comprising:
   a vacuum chamber for connection to a vacuum source;
   a source support for positioning a source of the material within said chamber in the path of a first coherent beam of light; and
   a substrate support for positioning the substrate within said chamber in the path of a second coherent beam of light and located such that the substrate is offset from a normal to the source surface by a fixed distance so that the substrate is outside of a conical volume extending from the source surface and bounded by a conical surface making an angle of 45° with respect to the source normal with respect to the source so that particles ejected from the source by said first coherent beam of light in a direction making an angle of less than 45° with respect to the normal to the source surface cannot deposit on the substrate.

2. The apparatus of claim 1, wherein:
   said source support further comprises a rotating source support; and
   said substrate support further comprises a rotating substrate support.

3. The apparatus of claim 2, further comprising:
   a first source of heat on said substrate support for heating the substrate; and
   a second source of heat on said source support for heating said source of the material.

4. The apparatus of claim 3, further comprising a cooled panel positioned behind said substrate support with respect to said source support to prevent multiple collisions of the evaporated material with the substrate.

5. The apparatus of claim 1, further comprising:
   a laser for providing a coherent light output;
   a beam divider for separating said coherent light output into said first and second coherent beams of light;
   a first window in said vacuum chamber for admitting said first coherent beam into said chamber; and
   a second window in said vacuum chamber for admitting said second coherent beam into said chamber.

6. The apparatus of claim 5 further comprising an up collimator situated in the path of said coherent light output for increasing the cross sectional area of said coherent light output.

7. The apparatus of claim 6, further comprising:
   a first lens situated in the path of said first coherent beam to focus said first beam on said source; and
   a second lens situated in the path of said second coherent beam to focus said second beam on said substrate.

8. The apparatus of claim 7, wherein said first and second lenses are adjustable to control the foci of said first and second beams.

9. The apparatus of claim 8, further comprising:
   a first x-y scanner situated in the path of said first coherent beam of light for scanning said first beam over said source of the material; and
   a second x-y scanner situated in the path of said second coherent beam of light for scanning said second beam over the substrate.

10. The apparatus of claim 9, wherein said first and second x-y scanners further comprise galvanometric scanners.

11. The apparatus of claim 10, wherein said laser further comprises a Q-switched solid state laser.

12. The apparatus of claim 11, wherein said laser further comprises an Nd: YAG laser.

13. The apparatus of claim 5, further comprising:
   a second beam divider for separating said first coherent beam of light into a third coherent beam of light and a fourth coherent beam of light, said third coherent beam passing through said first window into said chamber and impinging on said source of the material;
   a third window in said vacuum chamber for admitting said fourth beam; and
   a second source support for positioning a second source of a second material within said chamber in the path of said fourth coherent beam of light.

* * * * *